United States Patent
Chatterjee et al.

(10) Patent No.: US 6,235,668 B1
(45) Date of Patent: May 22, 2001

(54) MAKING CRYSTALLINE MAGNESIUM ORTHOSILICATE

(75) Inventors: Dilip K. Chatterjee; Thomas N. Blanton; Debasis Majumdar, all of Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/361,878

(22) Filed: Jul. 27, 1999

(51) Int. Cl.$^7$ .............................. C04B 35/20; C04B 35/04
(52) U.S. Cl. ...................... 501/122; 501/133; 423/331; 117/942
(58) Field of Search .................................. 901/122, 133; 423/331; 501/120; 117/942

(56) References Cited

U.S. PATENT DOCUMENTS

| | | |
|---|---|---|
| 4,420,352 | 12/1983 | Schroeder et al. . |
| 4,724,020 | 2/1988 | Ebata et al. . |
| 4,767,479 | 8/1988 | Ferguson et al. . |
| 4,928,870 | 5/1990 | Gat-Liquornik et al. . |
| 4,952,454 | 8/1990 | Iwamoto et al. . |
| 5,009,359 | 4/1991 | Stover et al. . |
| 5,174,853 | * 12/1992 | Yamaguchi et al. .................. 117/942 |
| 5,503,703 | 4/1996 | Dahotre et al. . |

* cited by examiner

Primary Examiner—Karl Group
(74) Attorney, Agent, or Firm—Raymond L. Owens

(57) ABSTRACT

A method of making polycrystalline magnesium orthosilicate including the steps of contacting a silica based clay material with magnesium oxide; and sintering the magnesium oxide contacting the silica based clay material to cause a solid state diffusion of the magnesium oxide into the silica based clay material to thereby produce polycrystalline magnesium orthosilicate. Single crystalline magnesium orthosilicate can be made by melting under controlled conditions, the polycrystalline magnesium orthosilicate.

8 Claims, 4 Drawing Sheets

MAKING CRYSTALLINE MAGNESIUM ORTHOSILICATE

CROSS REFERENCE TO RELATED APPLICATION

Reference is made to commonly assigned U.S. patent application Ser. No. 09/361,877 filed concurrently herewith, entitled "Bonding Materials Using Polycrystalline Magnesium Orthosilicate" by Blanton et al, the disclosure of which is incorporated herein.

FIELD OF THE INVENTION

The present invention relates to a method of making crystalline magnesium orthosilicate.

BACKGROUND OF THE INVENTION

Magnesium orthosilicate, whose chemical formula is $2MgO-SiO_2$ and chemical name is Forsterite is typically used for applications requiring a high coefficient of thermal expansion. The usual procedure for manufacture of this compound is to mix pure forms of magnesia and silica in stoichiometric proportions, then calcining and milling under controlled conditions, which can be modified to meet priority specifications. Typical applications of magnesium orthosilicates are in making substrates, particularly for high frequency electronics, thick films, and ceramic-to-metal seals and high temperature bonding or joining agents.

Magnesium orthosilicate can be doped with materials such as, chromium to form Cr:Forsterite. This crystal is a new tunable laser material that fills the spectral void in the near-IR region. The tuning range for such material covers the important spectral range from 1130 to 1348 nm, which provides a minimal dispersion in optical fibers. The Cr:Forsterite laser eventually explores its niche applications for semiconductor characterization, eye-safe ranging, medical, industrial, and scientific research.

Magnesium orthosilicate, when doped with iron, forms magnesium iron silicate. Its chemical name is Olivine and the chemical formula is $(MgFe)_2SiO_4$. The special class of Olivine is Peridot, which is green in color and can be of a transparent gem variety.

In recent years, a considerable increase in the potential and actual uses of certain ceramics for structural, chemical, electrical and electronic applications has occurred because of the strength, corrosion resistance, electrical conductivity and high temperature stability characteristics of these materials. Major applications for ceramics include $Si_3N_4$/steel and $Si_3N_4$/Al joints in gas turbines and diesel engines, recuperators in heat exchangers, $Si_3N_4$/steel and $Si_3N_4$/Ti joints in fuel cells, and $ZrO_2$/steel joints in friction materials for bearings, bushings, brakes, clutches and other energy absorbing devices. $ZrO_2$, $Al_2O_3$, and mullite/steel, $Si_3N_4$, and $Al_2O_3$ are also wear resistant materials. TiC/steel joints have been used as materials in cutting tools and dies used in metal fabrication. SiC, $Al_2O_3$ and BN/Al steel joints have also been used in space and military applications such as rocket nozzles, armor, missile bearings, gun barrel liners and as thermal protection barriers in space vehicles. SiC/C, $Al_2O_3$/Si and $Al_2O_3$/Cu are bonded to Al joints are used in electronic devices and other applications.

To perform effectively and efficiently for many of these applications, ceramic components chosen often must coexist with or be bonded with metallic components and form the system as a whole. Integration of ceramic-ceramic/metal hybrid parts into existing engineering designs can significantly enhance the performance of components.

The bonding or joining of ceramic parts or ceramic-metal components, however, presents a number of problems. For example, ceramic materials may differ, and ceramics and metals differ greatly in terms of modulus of elasticity, coefficient of thermal expansion, and thermal diffusivity. Accordingly, large thermally induced mechanical stresses are set up in the joint regions during bonding. In the past, this problem has been overcome only with limited success in using common techniques such as diffusion bonding, arc and oxyfuel fusion welding, brazing, soldering, and mechanical attachment techniques. Thus, while diffusion bonding has proven useful for producing joints with good elevated temperature properties, the practicality of this method is limited since it frequently requires vacuum and/or hot pressing equipment. Moreover, in the case of complicated shapes of the workpiece having non-planer mating surfaces, clamping of the workpiece to press pistons of a diffusion welding apparatus is needed to apply pressure to surfaces to be joined, which is often expensive. The maximum size of the surface area to be joined depends in such cases on the maximum force that can be brought to bear on the junction location. Alternatively, conventional fusion welding techniques create potentially critical conditions, since the material at the interface is superheated for a substantially long time, rises to accelerated reaction rates, and leads to extensive interdiffusion of species. This situation results in the formation of an entirely different microstructure with degraded mechanical and chemical properties. In general, fusion welding may only be considered for materials with low stress applications.

While soldering and brazing techniques are relatively simple to carry out and may be conducted at lower temperatures, the procedure requires elaborate surface preparation, and most importantly, the joints produced are limited to applications, which do not involve high strength or high temperature.

Other techniques, such as mechanical interlocking or electron-beam welding, have their own peculiar drawbacks. For example, electron-beam welding requires the use of a vacuum chamber. Additionally, it cannot be used with ease for dielectrics because of charge buildup on the insulating ceramics.

For a more complete description of techniques for bonding ceramic parts see the following patents:

Schroeder et al. U.S. Pat. No. 4,420,352 discloses the joining of ceramic heat exchanger parts wherein the adjacent surfaces to be joined are locally heated by RF heating.

Ebata et al. U.S. Pat. No. 4,724,020 discloses a similar process but wherein, the local heating is by high voltage torches. These disclosures require specific heating and preheating apparatus adding to the cost of the joining process.

Ferguson et al. U.S. Pat. No. 4,767,479 discloses a method of bonding green (unfired) ceramic casting cores. The casting cores are made up of ceramic particles and a binder. The binder in the casting cores is softened by applying a solvent and then ceramic filler particles are added to at least one of the surfaces to be joined. Thereafter, the ceramic casting cores are assembled until the solvent has evaporated. The bond strength of such joints are, however, dependent on the binder, and the use of solvents in the joining process may not be environmentally desirable.

Gat-Liquornik et al. U.S. Pat. No. 4,928,870 discloses the joining of ceramic parts by placing a metal foil or wire between the surfaces to be joined under high pressure and then subjecting the metal foil or wire to a high current for a short period of time. However, the presence of a metal at the interface may adversely affect the physical properties, e.g., corrosion resistance, and thermal conductivity of the ceramic parts.

Iwamoto et al. U.S. Pat. No. 4,952,454 discloses the joining of ceramic parts wherein a paste including metals and metal oxides in an organic binder is applied to the surfaces to be joined and then the assembly is heated to effect bonding. The organic binder upon pyrolysis can cause pores at the interface, thereby, adversely affecting the bond strength of the joined product.

Stover et al. U.S. Pat. No. 5,009,359 discloses diffusion welded joints of ceramic parts that are produced by first plasma spraying a bonding material at the seam of the mating pieces, followed by hot isostatic pressing. Such a two-step process adds to the complexity of the joining operation.

Dahotre et al. U.S. Pat. No. 5,503,703 discloses a ceramic joining process that involves using an interlayer of a mixture of two materials and reacting the materials with laser irradiation to form a thermally stable compound suitable for bonding the bodies together. The process, however, puts serious limitation on the choice of reacting materials, reaction products, reaction temperature and the ambient to avoid deleterious effects on the physical properties of the bond. Moreover, the process requires the use of a high intensity laser adding to the cost of the joining process.

It is amply clear that although the prior art is replete with numerous ceramic joining processes, there remains an important need for further innovation for an improved method of ceramic-ceramic or ceramic-metal bonding. Most importantly, there is a need for such a method which produces a bond suitable for high temperature applications, using materials of modest cost in a relatively simple and economic process.

SUMMARY OF THE INVENTION

It is an object of the present invention to provide a method for producing crystalline magnesium orthosilicate.

It is a further object of the invention to eliminate many of the costly processes used in producing crystalline magnesium orthosilicate.

These objects are achieved in a method of making polycrystalline magnesium orthosilicate comprising the steps of:

(a) contacting a silica based clay material with magnesium oxide; and (b) sintering the magnesium oxide contacting the silica based clay material to cause a solid state diffusion of the magnesium oxide into the silica based clay material to thereby produce polycrystalline magnesium orthosilicate.

These objects are also achieved in a method further including doping polycrystalline magnesium orthosilicate with chromium, chromium oxide and nickel or nickel oxide.

It is an advantage of the present invention that polycrystalline magnesium orthosilicate can be efficiently produced in a simple process without using complicated steps. Single crystalline magnesium orthosilicate can be made by melting under controlled conditions, the polycrystalline magnesium orthosilicate.

DETAILED DESCRIPTION OF THE PREFERRED EMBODIMENTS

Figure 1:
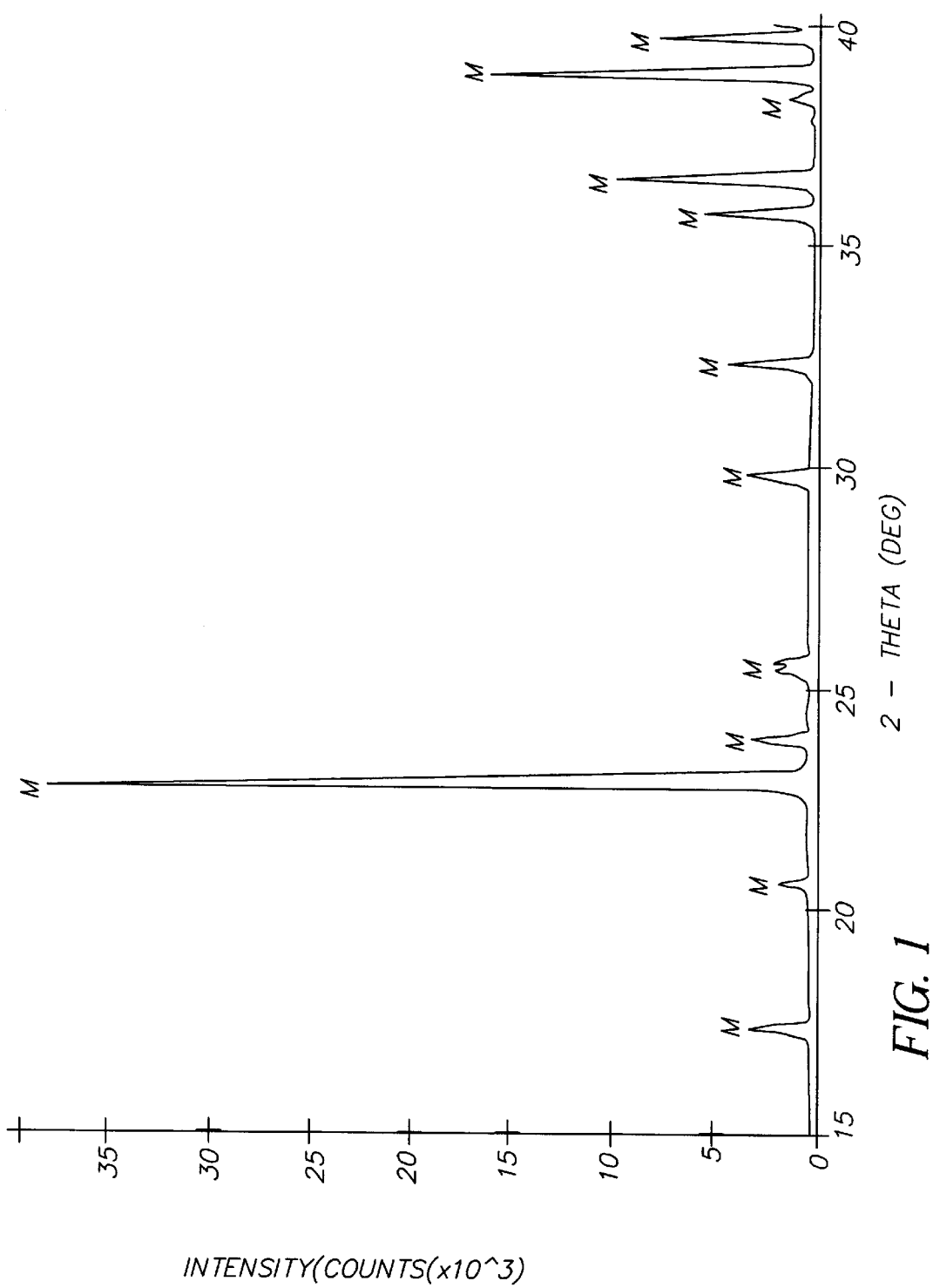
FIG. 1 shows a polycrystalline diffraction pattern collected using a Rigaku RU-300 diffractometer, for Laponite clay deposited on MgO and sintered at 1500° C. for 2 hours (M—$Mg_2SiO_4$ diffraction peaks)

The silica based clay material used in this invention belongs to the general class of phyllosilicates. A preferred choice includes smectite clays, both natural and synthetic. One such material which can be used in accordance with this invention is a commercially available synthetic smectite clay which closely resembles the natural clay mineral hectorite in both structure and composition. Hectorite is a natural swelling clay which is relatively rare and occurs contaminated with other minerals such as quartz which are difficult and expensive to remove. Synthetic smectite is free from natural impurities, prepared under controlled conditions and commercially marketed under the tradename Laponite by Laporte Industries, Ltd of UK through its U.S. subsidiary, Southern Clay Products, Inc. It is a 3-layered hydrous magnesium silicate, in which magnesium ions, partially replaced by suitable monovalent ions such as lithium, sodium, potassium and/or vacancies, are octahedrally bound to oxygen and/or hydroxyl ions, some of which may be replaced by fluorine ions, forming the central octahedral sheet; such an octahedral sheet is sandwiched between two tetrahedral sheets of silicon ions, tetrahedrally bound to oxygen.

There are many grades of Laponite such as RD, RDS, J, S, etc. each with unique characteristics and can be used for the present invention. Some of these products contain a polyphosphate peptizing agent such as tetrasodium pyrophosphate for rapid dispersion capability; alternatively, a suitable peptizer can be incorporated into Laponite later on for the same purpose. Typical chemical analyses of various grades of Laponite RDS and their physical properties, are disclosed in Laponite Product Bulletins.

TABLE 1

| Typical Chemical Analysis | |
|---|---|
| Component | Weight % |
| $SiO_2$ | 54.5 |
| MgO | 26.0 |
| $Li_2O$ | 0.8 |
| $Na_2O$ | 5.6 |
| $P_2O_5$ | 4.1 |
| Loss on ignition | 8.0 |

TABLE 2

Typical Physical Properties

| Appearance | White Powder |
| --- | --- |
| Bulk density | 1000 kg/m$^3$ |
| Surface Area | 330 m$^2$/g |
| pH (2% suspension) | 9.7 |
| Sieve analysis, | 98% <250 microns |
| Moisture content | 10% |

Laponite separates into platelets of lateral dimension of 25–50 nm and a thickness of 1–5 nm in deionized aqueous dispersions, commonly referred to as "sols." Typical concentration of Laponite in a sol can be 0.1% through 10%. During dispersion in deionized water an electrical double layer forms around the clay platelets resulting in repulsion between them and no structure build up. However, in sols containing electrolytes introduced from tap water or other ingredients (e.g., some latex polymers), the double layer can be reduced resulting in attraction between the platelets forming a "House of Cards" structure, and build-up of viscosity. Such sols can be easily coated on a substrate by suitable means.

In accordance with the present invention polycrystalline magnesium orthosilicate is made by the following steps:

(a) contacting a silica based clay material with magnesium oxide, preferably the weight ratio of silica based clay:MgO is in the range of 10:90 to 90:10; and (b) sintering the magnesium oxide contacting the silica based clay material to cause a solid state diffusion of the magnesium oxide into the silica based clay material to thereby produce polycrystalline magnesium orthosilicate. In the examples which follow the silica based clay material is Laponite.

The diffraction pattern shown in FIG. 1 indicates that the Laponite clay—MgO mixture has converted to Mg$_2$SiO$_4$, an olivine-type mineral known as forsterite, upon sintering the mixture at 1500° C. for 2 hours. The presence of multiple diffraction peaks is consistent with this sample being polycrystalline.

Figure 2:
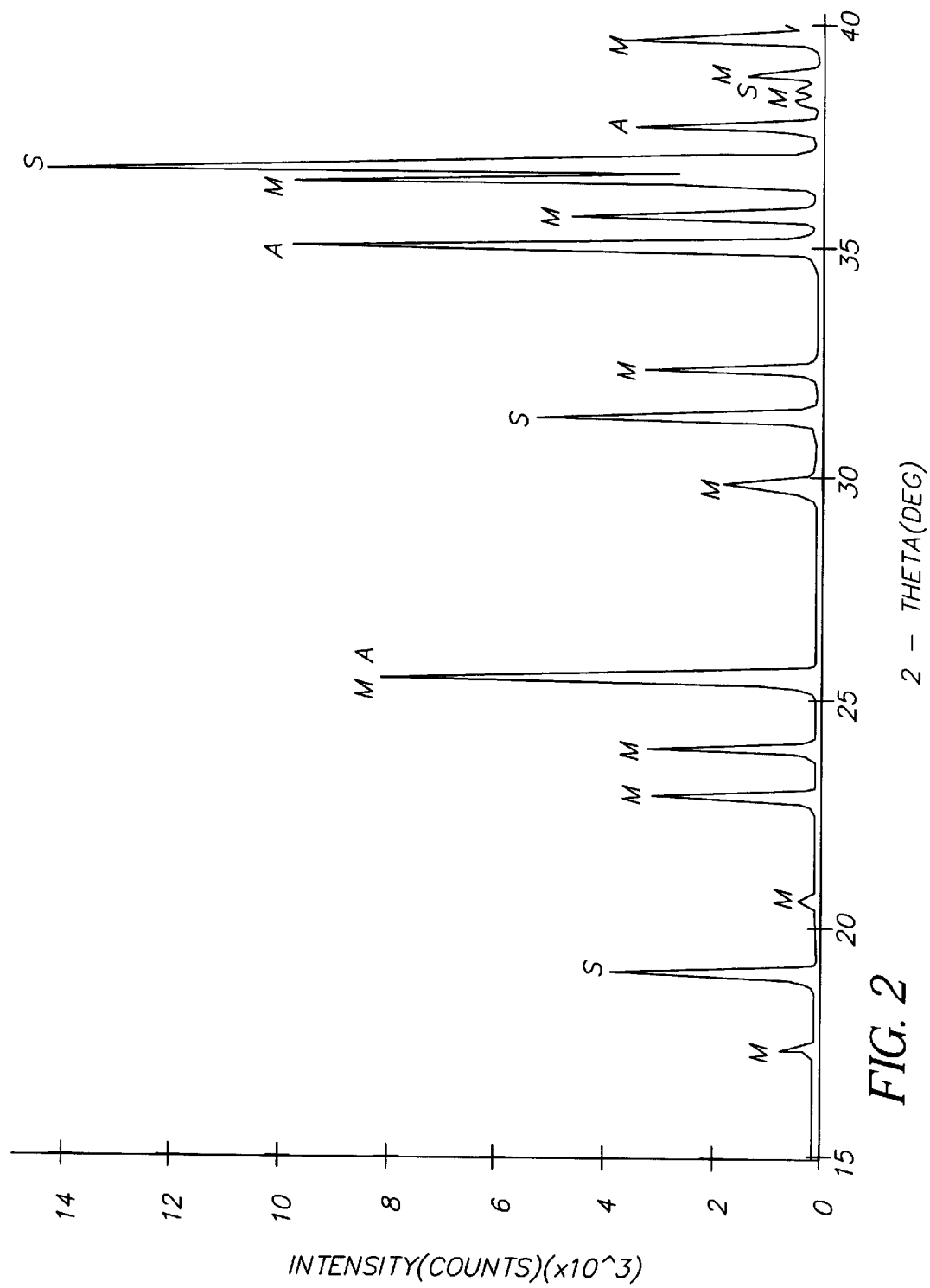
FIG. 2 shows a polycrystalline diffraction pattern collected using a Rigaku RU-300 diffractometer, for Laponite clay mixed with $ZrO_2$ (70 Laponite clay: 30 $ZrO_2$ wt:wt) deposited on MgO and sintered at 1500° C. for 2 hours (M—$Mg_2SiO_4$ peaks, Z(c)—Cubic $ZrO_2$ peaks)

The diffraction pattern shown in FIG. 2 indicates that when a Laponite clay—ZrO$_2$ mixture deposited on MgO is sintered at 1500° C. for 2 hours, MgO reacts with the clay to form Mg$_2$SiO$_4$ (Forsterite) and the MgO reacts with the ZrO$_2$ generating cubic zirconia The presence of multiple diffraction peaks is consistent with this sample being polycrystalline.

Figure 3:
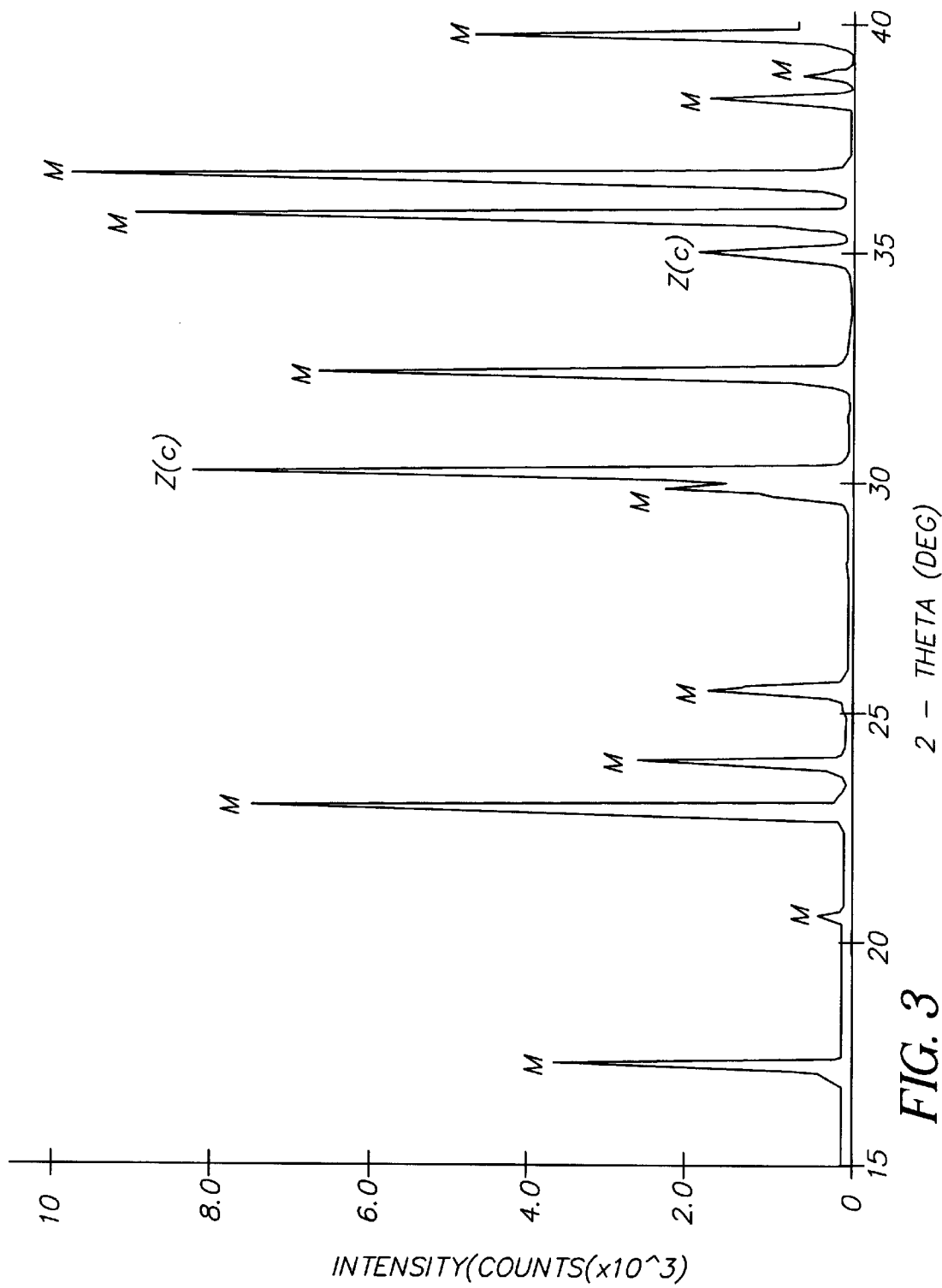
FIG. 3 shows a polycrystalline diffraction pattern collected using a Rigaku RU-300 diffractometer, for Laponite clay mixed with MgO (45 Laponite clay:55 MgO wt:wt) deposited on α—$Al_2O_3$ and sintered at 1500° C. for 2 hours (M—$Mg_2SiO_4$, S—$MgAl_2O_4$, A—α—$Al_2O_3$)

The diffraction pattern shown in FIG. 3 indicates that when a Laponite clay—MgO mixture is deposited on Al$_2$O$_3$ and sintered to 1500° C. for 2 hours, the MgO reacts with the clay to form Mg$_2$SiO$_4$ (Forsterite) and the MgO reacts with the Al$_2$O$_3$ generating MgAl$_2$O$_4$ (spinel). Unreacted Al$_2$O$_3$ from the substrate was also detected in the sample. The presence of multiple diffraction peaks is consistent with this sample being polycrystalline.

In accordance with the present invention a method of making single crystalline magnesium orthosilicate includes the steps of:

(a) forming a mixture of silica based clay and an oxide ceramic;

(b) contacting the silica based clay and oxide ceramic mixture with magnesium oxide; and (c) sintering the magnesium oxide contacting the silica based clay material to cause a solid state diffusion of the magnesium oxide into the silica based clay and the oxide ceramic mixture to form a compound and melting the compound to thereby produce single crystalline magnesium orthosilicate. In the example which follows, the silica based clay material is Laponite.

Figure 4:
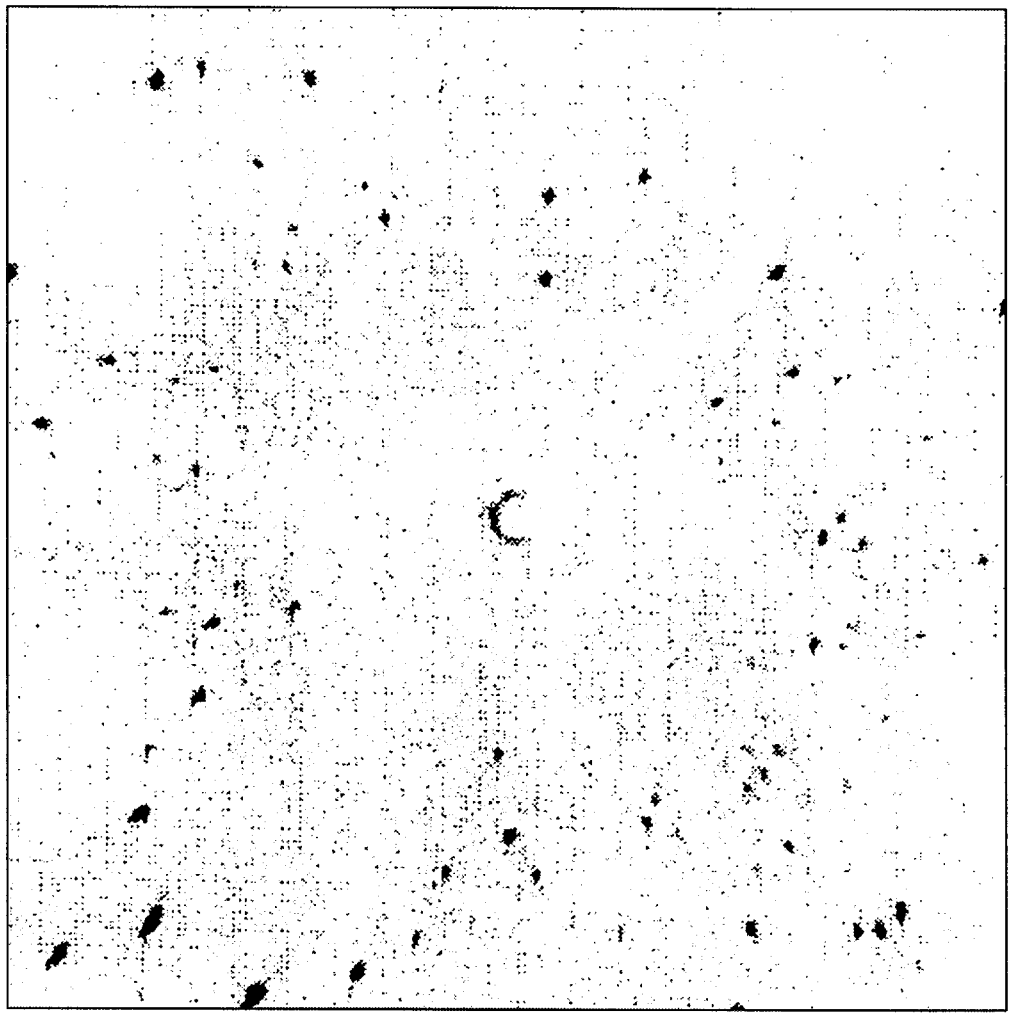
FIG. 4 shows a single crystalline diffraction pattern collected using a Bruker GADDS microdiffractometer, for a single crystal removed from a sample of Laponite clay mixed with $ZrO_2$ (70 Laponite clay:30 $ZrO_2$ wt:wt) deposited on MgO and sintered at 1500° C.

The diffraction pattern shown in FIG. 4 is from a single crystal extracted from a sample of Laponite clay—ZrO$_2$ deposited on MgO and sintered at 1500° C. for 2 hours. The spot pattern is a Laue-type pattern indicating that the specimen analyzed was in fact a single crystal (A polycrystalline sample would result in a series of diffraction rings). Integration of the spot positions and intensities indicate that the single crystals generated in this manner are Mg$_2$SiO$_4$ (Forsterite).

In accordance with the invention it has been found that magnesium orthosilicate phase formation at a relatively lower temperature in the range of 1300° C. to 1600° C., preferably at 1500° C. is a significant phenomenon compared to the reported higher temperature of its melt formation at 1900° C.

Instead of using silicates, synthetic clay material, such as Laponite clay was mixed with magnesium oxide, either in the powder or bulk form and the mixture of these two ingredients were heated in the range of 1300–1600° C., preferably at 1500° C. for 2 hours. Depending on the substrates used for the chemical reactions to occur at high temperature, various phases such as cubic zirconia and spinel along with polycrystalline magnesia orthosilicate are formed as illustrated in FIGS. 1 to 3.

In certain instances, single crystal magnesia orthosilicate phase has formed as shown in FIG. 4. This is presumably due to use of higher proportions of clay which results in the formation of a flux which allowed the growth of single crystals from the melt. It has been determined that a clay content more than 65 weight percent is necessary for single crystal formation. These single crystals can be found to be present with polycrystalline phases.

It has been found that molten polycrystalline magnesium orthosilicate can be effectively used to bond two materials which include a metal with a ceramic or two ceramic oxide materials. Steps involved in making the polycrystalline magnesium orthosilicate are as follows:

(a) contacting a silica based clay material with magnesium oxide; and (b) sintering the magnesium oxide contacting the silica based clay material to cause a solid state diffusion of the magnesium oxide into the silica based clay material to thereby produce polycrystalline magnesium orthosilicate compound. In order to bond two materials together which can be either a metal and a ceramic or two similar or dissimilar ceramics the following steps are used:

(a) melting the polycrystalline magnesium orthosilicate compound; and (b) applying the melted polycrystalline magnesium orthosilicate compound between two materials which are metal with a ceramic or two ceramic materials bonding using the polycrystalline magnesium orthosilicate to bond the two materials together.

Molten magnesium orthosilicate was found to be an effective joining/bonding compound for a metal and a ceramic, or for two ceramic materials, or two metallic materials, which are either similar or dissimilar. Noble metals and their alloys, Pt, Au, Pd, Ir, Pt—Rh, Pt—Ir, Au—Pd for example, and transition metals and their alloys, Fe, Ni, Ti, Fe—Ni, Ni—Co for example, are particularly suitable for metal to metal (or alloy to alloy) bonding. For specific examples, the following materials were bonded together $ZrO_2/ZrO_2$, $ZrO_2/MgO$, $MgO/MgO$, $Al_2O_3/ZrO_2$, $Al_2O_3/Al_2O_3/MgO$, $Al_2O_3$/Platinum, $ZrO_2$/Platinum. The integrity of the joints was evaluated by standard drop test methods and the microstructures of the bonded regions were examined. From these tests, it was determined that the joints were of acceptable quality.

The invention has been described in detail with particular reference to certain preferred embodiments thereof, but it will be understood that variations and modifications can be effected within the spirit and scope of the invention.

What is claimed is:

1. A method of making polycrystalline magnesium orthosilicate comprising the steps of:
    (a) contacting a silica based clay material with magnesium oxide; and
    (b) sintering the magnesium oxide contacting the silica based clay material to cause a solid state diffusion of the magnesium oxide into the silica based clay material to thereby produce polycrystalline magnesium orthosilicate.

2. The method of claim 1 wherein the magnesium oxide before contacting the silica based clay material is either in powder or solid form.

3. The method of claim 1 where the weight ratio of silica based clay:MgO is in the range of 10:90 to 90:10.

4. The method of claim 1 further including doping polycrystalline magnesium orthosilicate with chromium, chromium oxide, nickel or nickel oxide.

5. A method of making single crystalline magnesium orthosilicate comprising the steps of:
    (a) forming a mixture of silica based clay and an oxide ceramic;
    (b) contacting the silica based clay and oxide ceramic mixture with magnesium oxide; and
    (c) sintering the magnesium oxide contacting the silica based clay material to cause a solid state diffusion of the magnesium oxide into the silica based clay and the oxide ceramic mixture to form a compound and melting the compound to thereby produce single crystalline magnesium orthosilicate.

6. The method of claim 5 wherein the weight ratio of silica based clay:MgO is in the range of 65:35 to 90:10.

7. The method of claim 1 wherein the sintering temperature is a range of 1300 to 1600° C.

8. The method of claim 5 further including doping single crystalline magnesium orthosilicate with chromium, chromium oxide, nickel or nickel oxide.

* * * * *